US006307385B1

(12) United States Patent
Tardif et al.

(10) Patent No.: US 6,307,385 B1
(45) Date of Patent: Oct. 23, 2001

(54) CAPACITANCE MEASURING CIRCUIT FOR A CAPACITIVE SENSOR

(75) Inventors: Bruno Tardif, Varennes; Jean Pronovost, St-Mathieu-de-Beloeil, both of (CA)

(73) Assignee: VibroSystm, Inc., Longueil (CA)

( * ) Notice: Subject to any disclaimer, the term of this patent is extended or adjusted under 35 U.S.C. 154(b) by 0 days.

(21) Appl. No.: 09/221,738

(22) Filed: Dec. 28, 1998

Related U.S. Application Data
(60) Provisional application No. 60/070,055, filed on Dec. 30, 1997.

(51) Int. Cl.$^7$ ................................................. G01R 27/26
(52) U.S. Cl. ................................................. 324/678; 324/629
(58) Field of Search ........................... 324/678, 679, 324/686, 688, 689, 663, 664

(56) References Cited

U.S. PATENT DOCUMENTS

| | | | |
|---|---|---|---|
| 4,187,460 | * 2/1980 | Dauge et al. | 324/678 |
| 4,261,397 | 4/1981 | Guy | 141/1 |
| 4,311,959 | 1/1982 | Riessland et al. | 324/61 |
| 4,347,741 | 9/1982 | Geiger | 73/304 |
| 4,404,481 | * 9/1983 | Ide et al. | 307/491 |
| 4,661,768 | * 4/1987 | Carusillo | 324/678 |
| 4,661,797 | 4/1987 | Schmall | 340/561 |
| 4,675,670 | 6/1987 | Lalonde et al. | 340/870 |
| 4,677,275 | 6/1987 | Schmall | 219/124.03 |
| 4,682,272 | 7/1987 | Furlong et al. | 361/437 |
| 4,766,368 | 8/1988 | Cox | 324/61 |
| 4,912,662 | 3/1990 | Butler et al. | 364/559 |
| 5,012,196 | 4/1991 | Baranski | 324/662 |
| 5,014,011 | 5/1991 | Colvin | 324/663 |
| 5,153,525 | 10/1992 | Hoekman et al. | 324/655 |
| 5,166,679 | 11/1992 | Vranish et al. | 340/870.37 |
| 5,235,217 | 8/1993 | Kirton | 307/326 |
| 5,237,284 | 8/1993 | Van Der Valk | 324/377 |
| 5,326,983 | 7/1994 | Hejazi | 250/589 |
| 5,399,979 | 3/1995 | Henderson et al. | 324/377 |
| 5,410,297 | 4/1995 | Joseph et al. | 340/573 |
| 5,583,443 | 12/1996 | McMurthry et al. | 324/601 |
| 5,610,528 | 3/1997 | Neely et al. | 324/660 |

OTHER PUBLICATIONS

Microelectronic Circuits of Sedra/Smith, the fourth edition pp. 1009–1011.*
Lin, Jackson; Bissonnette, Marc R., A New Capacitive Proximity Probe Immune To Electrical Runout, Nov. 3, 1997.
Lin, Jackson, Uprating and Refurbishing Hydro Powplants VI, Oct. 1997.
VibroSystM Inc., Results That Speak for Themselves, Dec. 1996.
VibroSystM Inc., Vibrawatch™, Revolutionizing the Vibration Monitoring Industry, Jul. 1996.
VibroSystM Inc., Vibrawatch™, Innovative Vibration Monitoring, Nov. 1996.

* cited by examiner

*Primary Examiner*—Safet Metjahic
*Assistant Examiner*—Vincent Q. Nguyen
(74) *Attorney, Agent, or Firm*—Brinks Hofer Gilson & Lione

(57) ABSTRACT

The circuit and the method are for measuring a capacitance of a capacitive sensor. According to the method, a charging circuit charges the capacitive sensor with a voltage and a discharging circuit discharges the capacitive sensor. A trigger circuit triggers the charging circuit and the discharging circuit in alternation into play as a potential of the capacitive sensor drops and rises to predetermined lower and upper levels respectively. An output circuit provides a signal having a low level during operation of one of the charging and discharging circuit and a high level during operation of the other one of the charging and discharging circuit. The signal has a period defined by a same level repetition which is indicative of the capacitance of the capacitive sensor.

5 Claims, 6 Drawing Sheets

CAPACITANCE MEASURING CIRCUIT FOR A CAPACITIVE SENSOR

This application claims benefit of Provisional No. 60/070,055 filed Dec. 30, 1997.

FIELD OF THE INVENTION

The present invention relates to a measuring circuit for a capacitive sensor, and more particularly to a capacitance measuring circuit producing a signal having a period that varies as a function of the charge and discharge times of the capacitive sensor. The circuit can be advantageously used in combination with a capacitive sensor installed on a rotating shaft, to measure the vibration or the circularity of the shaft.

BACKGROUND

Capacitive sensors and probes are used in a great number of applications, for example to monitor a fluid level in a tank, to measure the distance between two moving parts of an object, to measure the vibration or wear of a rotating shaft, etc.

Known in the art are U.S. Pat. Nos. 4,261,397 (Guy)—4,311,959 (Riessland et al.)—4,347,741 (Geiger)—4,661,797 (Schmall)—4,675,670 (Lalonde et al.)—4,677,275 (Schmall)—4,682,272 (Furlong et al.)—4,766,368 (Cox)—4,912,662 (Butler et al.)—5,012,196 (Baranski)—5,014,011 (Colvin)—5,153,525 (Hoekman et al.)—5,166,679 (Vranish et al.)—5,235,217 (Kirton)—5,237,284 (Van Der Valk)—5,326,983 (Hejazi)—5,399,979 (Henderson et al.)—5,410,297 (Joseph et al.)—5,583,443 (McMurtry et al.)—5,610,528 (Neely et al.), showing examples of various types and configurations of capacitive sensors used in a multitude of applications.

Usually, in the case of a reading of a rotating shaft with a capacitive sensor, inductive technology involving EDDY currents is used. The drawback of this technique is that the user must calibrate or interpret the measurements of the sensor according to the type of material forming the shaft. Furthermore, a density variation of the material on the circumference of the shaft causes a variation of the measurement which is difficult to discriminate from the real circularity or vibrations to be measured. Other kind of applications involving the use of capacitive sensors are also subjected to the above drawback. Furthermore, the distance between the capacitive sensor and the reading/measuring apparatus usually causes some problems due to the impedance of the link between them.

SUMMARY

An object of the invention is to provide a circuit and a method that are insensitive to the type or the density variation of the conductive material involved in the process.

A subsidiary object of the invention is to provide such a circuit that is simple in construction, thus highly cost-competitive, yet is highly reliable and efficient.

According to the present invention, there is provided a circuit for measuring a capacitance of a capacitive sensor, comprising charging circuit means for charging the capacitive sensor with a voltage, discharging circuit means for discharging the capacitive sensor, trigger means for triggering the charging circuit means and the discharging circuit means in alternation into play as a potential of the capacitive sensor drops and rises to predetermined lower and upper levels respectively, and output means for providing a signal having a low level during operation of one of the charging and discharging circuit means and a high level during operation of the other one of the charging and discharging circuit means, whereby the signal has a period defined by a same level repetition which is indicative of the capacitance of the capacitive sensor.

According to the present invention, there is also provided a method for measuring a capacitance of a capacitive sensor, comprising the steps of charging the capacitive sensor with a voltage and discharging the capacitive sensor in alternation as a potential of the capacitive sensor drops and rises to predetermined lower and upper levels respectively, and providing a signal having a low level during one of the charging and discharging steps and a high level during the other one of the charging and discharging steps; whereby the signal has a period defined by a same level repetition which is indicative of the capacitance of the capacitive sensor.

The measuring circuit according to the invention can be compared in some ways to an oscillator circuit generating a signal having a period that varies as a function of the charge and discharge times of the capacitive sensor between two predetermined voltage thresholds. The charging and discharging of the capacitive sensor is preferably carried out through a set of resistors connected to the oscillator circuit having a first output controlling the charge and the discharge of the capacitive sensor, and a second output generating the measurement signal. The plates of the capacitive sensor are connected to a follower circuit, whose output is connected to the oscillator circuit. The second output of the oscillator circuit can be connected to a processing circuit to make the measurement linear.

BRIEF DESCRIPTION OF THE DRAWINGS

A detailed description of preferred embodiments will be given herein below with reference to the following drawings, in which like numbers refer to like elements.

DETAILED DESCRIPTION OF THE PREFERRED EMBODIMENTS

Figure 1:
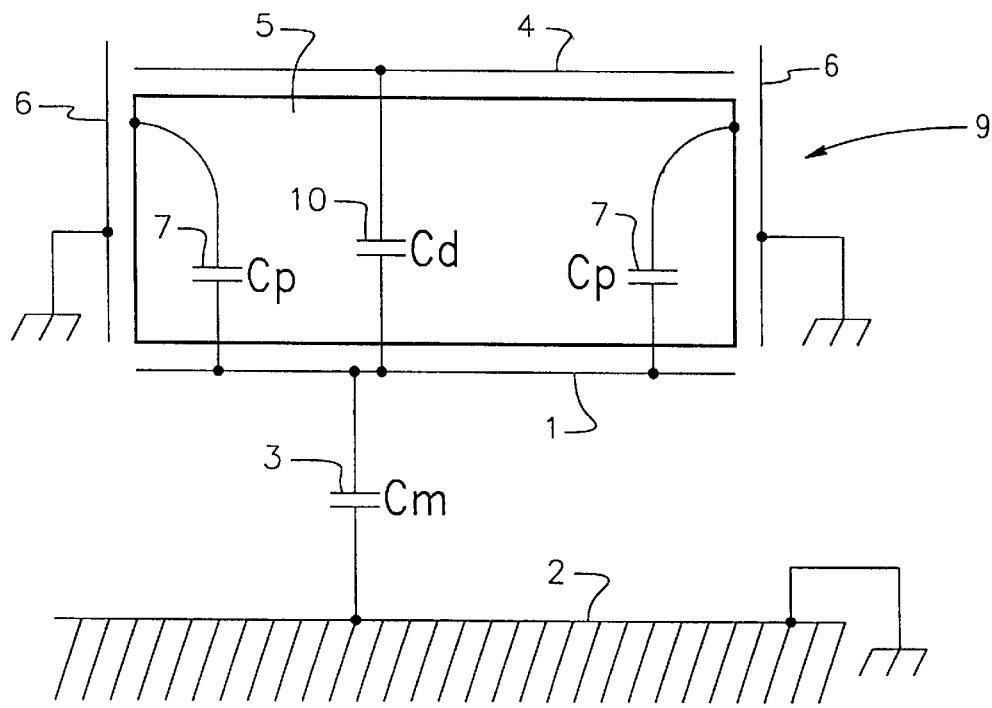
FIG. 1 is a schematic diagram of a capacitive sensor adapted to operate with a measuring circuit according to the invention.

Referring to FIG. 1, there is shown a schematic diagram of a capacitive sensor 9 adapted to operate with the measurement circuit according to the invention. This capacitive sensor 9 is similar to the one shown in U.S. Pat. No. 4,675,670. The capacitive sensor 9 (also called hereinafter as the measuring capacitor) comprises two parallel conductive plates 1 and 4 electrically insulated from each other by a dielectric 5. The plate 1 and the conductive or semiconductive matter 2 form a capacitor $C_m$ 3 having a capacitive value given by the relation:

$$C_m = K \cdot \frac{A}{D} \quad (1)$$

where:

$K = \epsilon_0 \cdot \epsilon_r$, $\epsilon_0$ being the vacuum permittivity (8,854 pF/m) and $\epsilon_r$ being the relative permittivity of the dielectric between the plate 1 and the matter 2;

A is the surface of the plate 1; and

D is the distance separating the plate 1 from the matter 2.

Considering the equation (1), the measurement ($C_m$) is thus independent from the type, the density and the density variation of the material forming the conductive or semiconductive matter 2.

The measurement can be in relation with any one of the parameters on the right hand part of equation (1). For example, the capacity $C_m$ 3 varies if the distance D is fixed and the surface A remains constant, while the dielectric value $\epsilon_r$ between the plate 1 and the matter 2 varies. There is thus obtained a sensor that can be used to measure the humidity in a wood piece inserted between the plate 1 and the matter 2, or also, a sensor measuring the variation of the properties of a fluid present between the plate 1 and the matter 2. If the dielectric characteristic of the milieu between the plate 1 and the matter 2 and the distance D remain constant, there is obtained a sensor whose capacity value $C_m$ 3 varies as a function of the surface A, where A is no longer the surface of the plate 1, but rather the surface of the plate 1 directly placed in front of the matter 2. There is then obtained an overlap sensor that is useful to measure lateral displacements of the matter 2.

Figure 2:
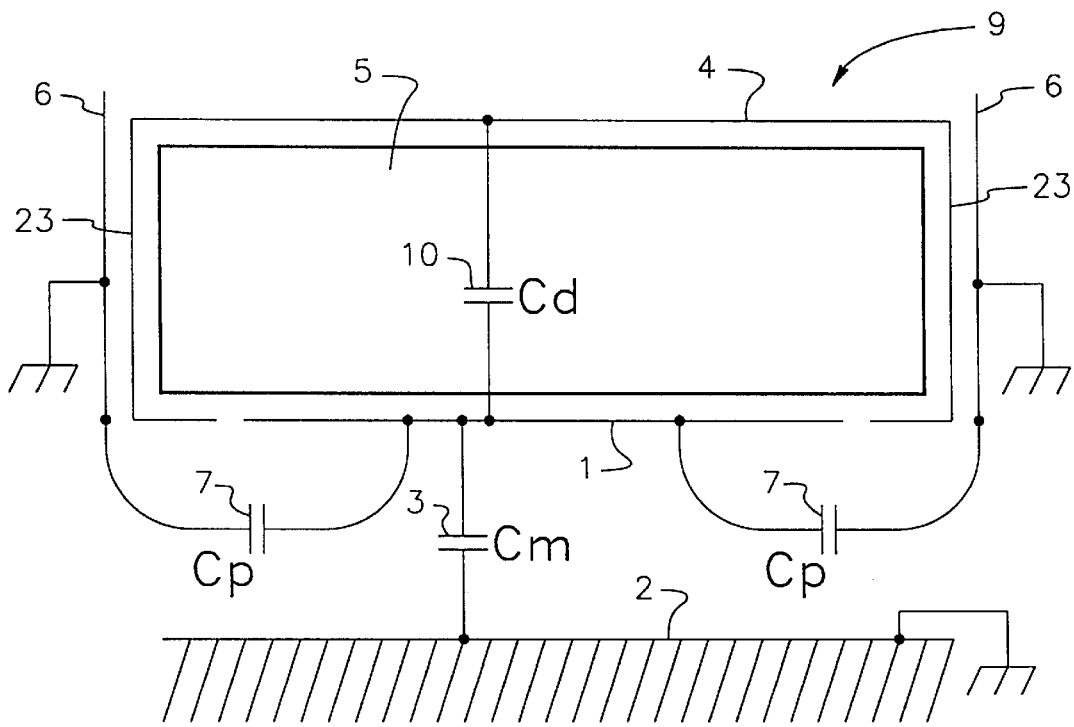
FIG. 2 is a schematic diagram of a capacitive sensor provided with a guard ring according to the invention.

Referring to FIG. 2, the plate 4 is used to form a shield as it is maintained at a potential similar to the potential of the plate 1 during the operation of the sensor 9, as explained hereinafter. This allows to obtain the lowest possible capacity $C_d$ 10 between the plates 1, 4 and to shield the capacitive sensor 9 against any perturbations that can exist behind the plate 4. The lateral plates 6 are maintained at the same potential as the target 2 to make the sensor 9 insensible to external objects and at the same time mechanically secure the sensor 9 to a frame during use. The plates 6, however form a parasitic capacity $C_p$ 7. The purpose of the shielding methods herein discussed is that only $C_m$ 3 varies according to the distance separating the plate 1 from the conductive or semiconductive surface 2.

A manner of reducing the value of the parasitic capacity $C_p$ 7 is to increase the distance between the plate 1 and the plates 6 by radially moving them away or by moving them towards the plate 4. However, in doing this, the external perturbations become more apparent. Another manner of reducing $C_p$ 7 is to add a guard ring 23 to the measuring capacitor 9 as illustrated in FIG. 2. The guard ring 23 is, in operation, subjected at the same potential as the plate 4, as hereinafter explained, to reduce $C_p$ 7 since the surfaces forming this parasitic capacity are smaller and more distant.

Figure 3:
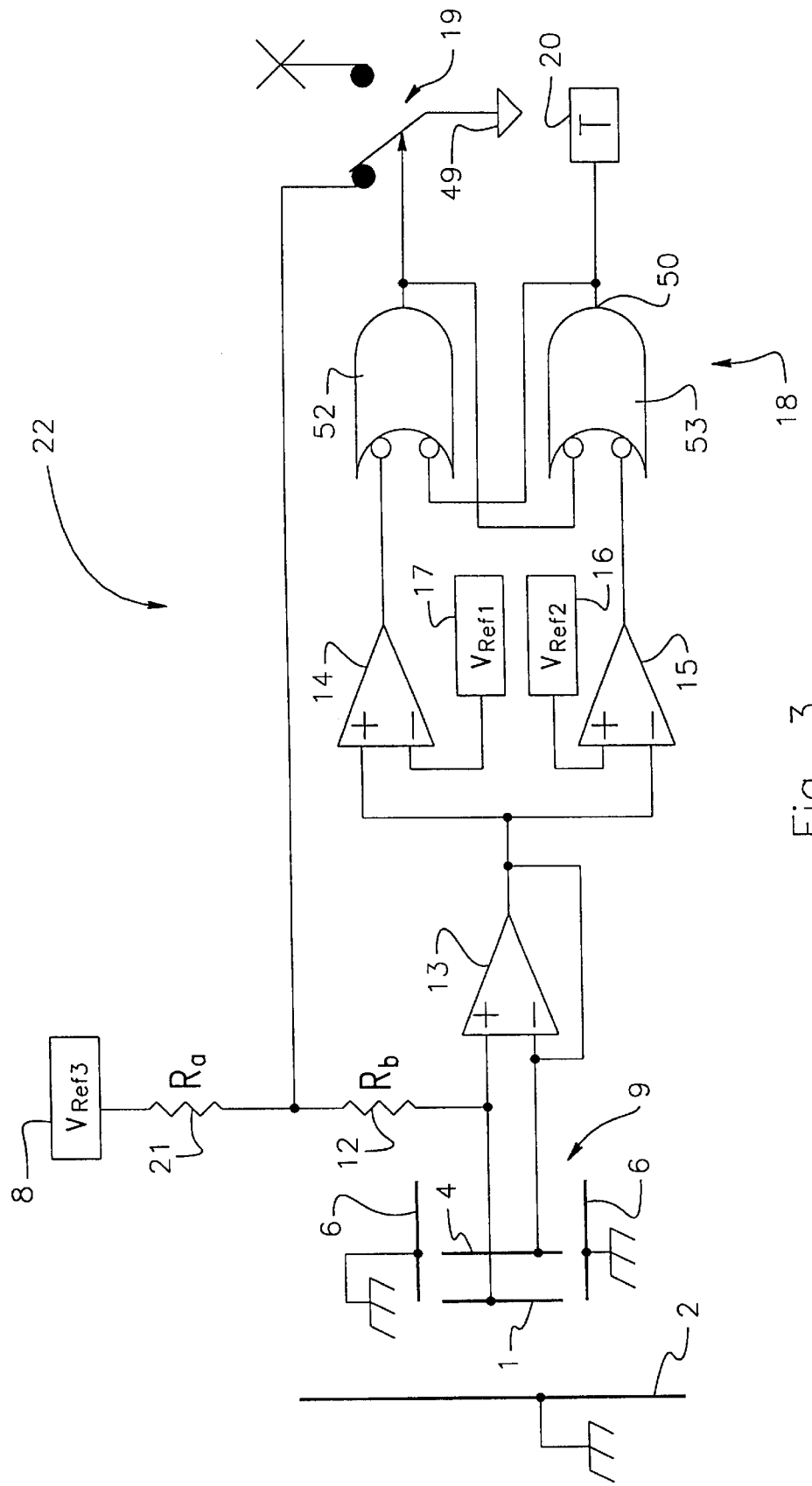
FIG. 3 is a schematic diagram of a first embodiment of the measuring circuit according to the invention, connected to a capacitive sensor.

Referring to FIG. 3, there is shown a measurement circuit for measuring the capacitance ($C_m$ as shown in FIGS. 1 and 2) of the capacitive sensor 9, according to the invention. The measurement circuit can be viewed as having an oscillator 22 connected to the capacitive sensor 9. The plate 1 of the capacitive sensor 9 is connected to the positive input of an operational amplifier 13 used as a buffer for the remainder of the circuit. The shielding plate 4 is connected to the negative input of the buffer 13 which, by the inherent property of an operational amplifier, causes the plates 1 and 4 (and 23 if a guard ring is used) to be all subjected to a similar potential. The principle of the oscillator 22 is that the total capacity perceived by the plate 1 is charged through the resistors $R_a$ 21 and $R_b$ 12 by a fixed voltage $V_{Ref3}$ until it reaches a reference potential or voltage $V_{Ref2}$ 16. At this moment, a comparator 15 activates a flip-flop 18 that activates (closes) a switch 19. Then, the total capacity perceived by the plate 1 is discharged through the resistor $R_b$ 12 connected at that time to the ground 49 until a fixed voltage equal to the reference potential or voltage $V_{Ref1}$ 17 is reached. A comparator 14 then activates the flip-flop 18 that activates (opens) the switch 19. The cycle is repeated with the recharging of the capacity. The voltages $VRef_1$, $V_{Ref2}$ and $V_{Ref3}$ can be provided by any suitable voltage sources.

The resistors $R_a$ 21, $R_b$ 12 in series between the voltage source 8 and the capacitive sensor 9, the voltage source 8, and the electrical path between these components, form a charging circuit through which the capacitive sensor 9 gets charged with a voltage. The resistor $R_b$ 12, the ground 49, the switch 19 when connecting the resistor $R_b$ 12 to the ground 49, and the electrical path between these components, form a discharging circuit through which the capacitive sensor 9 gets discharged. The charging and discharging circuits thus have a common portion consisting of the resistor $R_b$ 12. The comparators 14, 15, the flip-flop 18 and the switch 49, form a trigger circuit that triggers the charging and discharging circuits in alternation into play as a potential of the capacitive sensor 9 drops and rises to predetermined lower and upper levels respectively, provided by $V_{Ref1}$ 17 and $V_{Ref2}$ 16.

The output 50 of the flip-flop 18 provides a signal T 20 having a low level during operation of one of the charging and discharging circuit and a high level during operation of the other one of the charging and discharging circuit. The signal T 20 has a period defined by a same level repetition which is indicative of the capacitance of the capacitive sensor 9.

The switch 19 has a pole connected to the ground 49, and a pair of contacts, one of which is connected between the resistors 12, 21. The switch 19 is operated by a complementary output of the flip-flop 18, and selectively opens and closes the electrical path of the discharging circuit with the ground 49. The flip-flop 18 can be formed of a pair of negative inputs OR-gates 52, 53, with outputs cross-connected to respective inputs of the OR-gates 52, 53. The other inputs of the OR-gats 52, 53 are connected to the respective outputs of the comparators 14, 15 providing comparison results of the voltage of the capacitive sensor 9 with respect to the reference potentials $V_{Ref1}$ 17 and $V_{Ref2}$ 16.

During the charging step (in permanent mode), the voltage on the plate 1 follows the relation:

$$V_{charge}(t) = V_{Ref3} \cdot \left(1 - e^{\frac{-t}{(R_a + R_b)C}}\right) \quad (2)$$

During the discharging step (in permanent mode), the voltage on the plate 1 follows the relation:

$$V_{discharge}(t) = V_{Ref2} \cdot e^{\frac{-t}{R_b \cdot C}} \quad (3)$$

During the charging step (in permanent mode), the rising time of the voltage on the plate 1 is equal to:

$$T_{charge} = -(R_a + R_b) \cdot C \cdot \ln\left(\frac{V_{Ref3} - V_{Ref2}}{V_{Ref3} - V_{Ref1}}\right) \quad (4)$$

During the discharging step (in permanent mode), the falling time of the voltage on the plate 1 is equal to:

$$T_{discharge} = -R_b \cdot C \cdot \ln\left(\frac{V_{Ref1}}{V_{Ref2}}\right) \quad (5)$$

Therefore, the output signal T 20 will have a period represented by:

$$T = T_{charge} + T_{discharge} \quad (6)$$

It should be noted that in the above equations:

$$C = C_m + C_p + C_r \quad (7)$$

thus $C_m$ 3 and $C_p$ 7 of the FIGS. 1 and 2, but also $C_r$ that comprises any parasitic effect inherent to the capacitive sensor 9 and more globally to the oscillator 22.

To simplify, it can be considered that:

$$C_{pt} = C_p + C_r \quad (8)$$

Thus, the equation (1) becomes:

$$C = C_{pt} + K \cdot \frac{A}{D} \quad (9)$$

hence the equation of the period of the output signal 20 as a function of D, thus the distance between the plate 1 and the matter 2:

$$T = \left(C_{pt} + K \cdot \frac{A}{D}\right) \cdot \left\{-(R_a + R_b) \cdot \ln\left(\frac{V_{Ref3} - V_{Ref2}}{V_{Ref3} - V_{Ref1}}\right) - Rb \cdot \ln\left(\frac{V_{Ref1}}{V_{Ref2}}\right)\right\} \quad (10)$$

In this embodiment, the voltage $V_{Ref1}$ 17 must be smaller than the voltage $V_{Ref2}$ 16 and the voltage $V_{Ref2}$ 16 must be smaller than the voltage $V_{Ref3}$ 8. The voltages $V_{Ref1}$ 17 and $V_{Ref2}$ 16 represent respectively the lower and upper levels to be reached when the capacitive sensor 9 discharges and charges.

Figure 6:
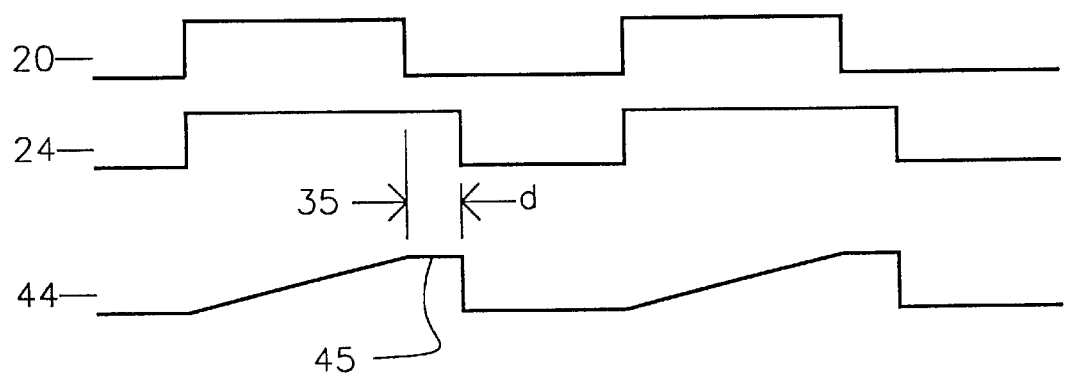
FIG. 6 is a time diagram showing examples of typical signals taken at different points of the circuits shown in FIGS. 7 and 8.

Referring to FIG. 6, there is shown an example of the signal T 20 produced by the measurement circuit. The high and low levels of the signal T 20 assume fixed values representing high and low logic states. It should be understood that the signal T 20 could assume a sine shape around the abscissa or other suitable shapes depending on the circuitry of the measurement circuit.

Figure 4:
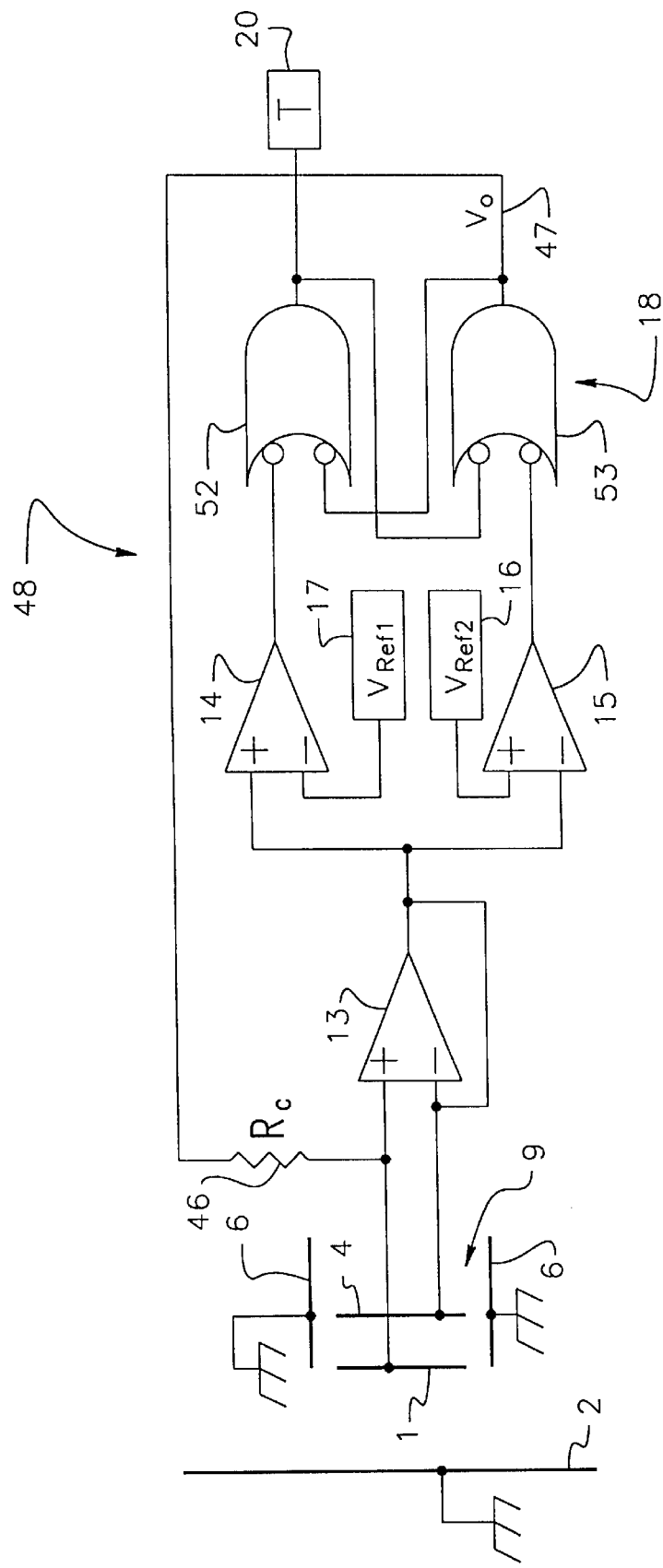
FIG. 4 is a schematic diagram of a second embodiment of the measuring circuit according to the invention, connected to a capacitive sensor.

Referring to FIG. 4, there is shown another embodiment of the measurement circuit according to the invention. The oscillator 48 operates substantially in the same way as the oscillator 22 shown in FIG. 3, with the exception of a few elements. Indeed, the charging and discharging steps of the measuring capacitor 9 are carried out through one and the same resistor $R_c$ 46. Furthermore, the voltage source $V_{Ref3}$ 8 is removed and the charging voltage of the capacitor 9 is now the voltage $V_0$ 47 provided by the flip-flop 18 in one state, the flip-flop 47 setting the voltage to ground in the other state to discharge the capacitive sensor 9.

During the charging step (in permanent mode), the voltage on the plate 1 follows the relation:

$$V_{charge}(t) = V_0 \cdot \left(1 - e^{\frac{-t}{R_c \cdot C}}\right) \quad (11)$$

During the discharging step (in permanent mode), the voltage on the plate 1 follows the relation:

$$V_{discharge}(t) = V_{Ref2} \cdot e^{\frac{-t}{R_c \cdot C}} \quad (12)$$

During the charging step (in permanent mode), the rising time of the voltage on the plate 1 is equal to:

$$T_{charge} = -R_c \cdot C \cdot \ln\left(\frac{V_0 - V_{Ref2}}{V_0 - V_{Ref1}}\right) \quad (13)$$

During the discharging step (in permanent mode), the falling time of the voltage on the plate 1 is equal to:

$$T_{discharge} = -R_c \cdot C \cdot \ln\left(\frac{V_{Ref1}}{V_{Ref2}}\right) \quad (14)$$

Therefore, using the same reasoning as for the oscillator 22 of the FIG. 3, the output signal T 20 will have a period represented by:

$$T = \left(C_{pt} + \frac{K \cdot A}{D}\right) \cdot \left(-R_c \cdot \ln\left(\frac{V_0 - V_{Ref2}}{V_0 - V_{Ref1}}\right) - Rc \cdot \ln\left(\frac{V_{Ref1}}{V_{Ref2}}\right)\right) \quad (15)$$

In this embodiment, the voltage $V_{Ref1}$ 17 must be lower than the voltage $V_{Ref2}$ 16, and the voltage $V_{Ref2}$ must be lower than the voltage $V_0$.

Figure 5:
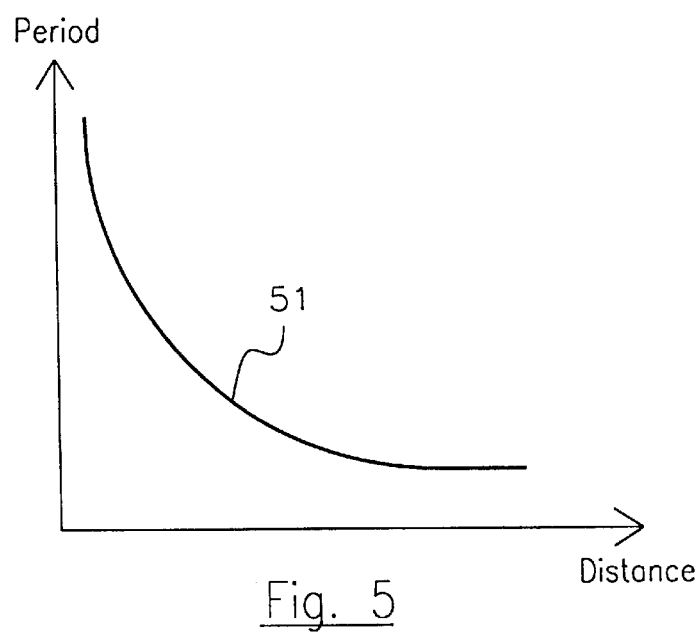
FIG. 5 is a graph showing a typical curve of the period of the signal produced by the measuring circuit according to the invention with respect to the distance subjected to a measurement by the capacitive sensor.

According to the equations (10) and (15), the relation between the period and the distance takes on the look of the curve 51 shown in FIG. 5.

According to the relation of the equation (9) and its illustration in FIG. 5, the period produced by the sensor 9 does not vary in a linear fashion with respect to the distance D between the surfaces 1 and 2. The determination of the value of the displacement of the conductive or semiconductive matter 2 would be easier if linearized by means of electronic devices designed and/or programmed as a function of the various physical parameters of the oscillator 22 or 48, to determine the value of the real displacement while accounting for the parasitic effects.

Figure 7:
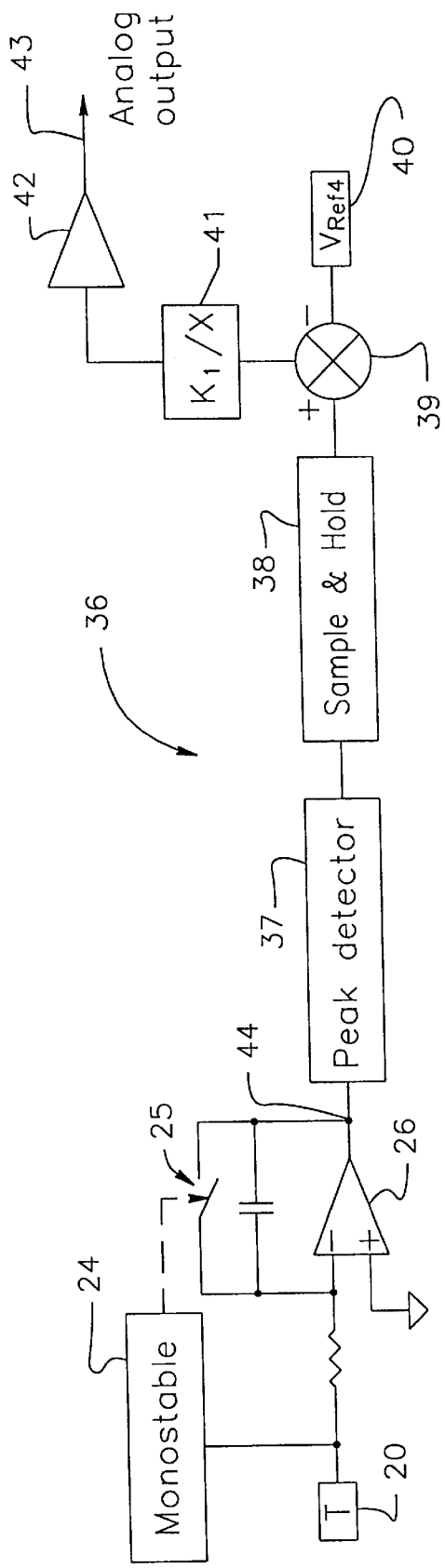
FIG. 7 is a schematic diagram of a first embodiment of a circuit to make the measurement linear, according to the invention.

Referring to FIG. 7, there is shown an example of an electronic device designed to linearize the value of the displacement. The device 36 has an input to receive the signal T 20, which is transmitted to an integrator 26 and a monostable 24. The monostable 24 controls the switch 25 which, by means of a delay d 35, as shown in FIG. 6, allows the integrator 26 to carry out a reset between each period as shown by the waveform 44 in FIG. 6. A peak detector 37 and a sample-and-hold circuit 38 provide a continuous level from the plateau 45 obtained at the output of the integrator 26. At the output of the sample-and-hold circuit 38, there is a voltage V that follows the relation:

$$V = K_A \cdot T \quad (16)$$

The shape of the voltage V as a function of the distance D between the plate 1 and the conductive matter 2 is the same as the curve 51 represented in FIG. 5. By taking the equation (10) and (15) and by stating:

$$K_B = -(R_a + R_b) \cdot \ln\left(\frac{V_{Ref3} - V_{Ref2}}{V_{Ref3} - V_{Ref1}}\right) - Rb \cdot \ln\left(\frac{V_{Ref1}}{V_{Ref2}}\right) \text{ or} \quad (17)$$

$$K_B = -R_C \cdot \ln\left(\frac{V_0 - V_{Ref2}}{V_0 - V_{Ref1}}\right) - R_C \cdot \ln\left(\frac{V_{Ref1}}{V_{Ref2}}\right) \quad (18)$$

depending on the oscillator used, there is obtained:

$$V = K_A \cdot K_B \cdot \left(C_{pt} + \frac{K \cdot A}{D}\right) \quad (19)$$

thus:

$$V = K_A \cdot K_B \cdot C_{pt} + K_A \cdot K_B \cdot \frac{K \cdot A}{D} \quad (20)$$

By stating:

$$V_{Ref4} = K_A \cdot K_B \cdot C_{pt} \quad (21)$$

then, at the output of the summing circuit 39, there is obtained:

$$V = K_A \cdot K_B \cdot \frac{K \cdot A}{D} \quad (22)$$

By stating, at the divider 41, the following equation:

$$K_1 = K_A \cdot K_B \cdot K \cdot A \quad (23)$$

there will be obtained, at the input of the buffer 42:

$$V = D \quad (24)$$

The signal V is then linear with respect to the distance D between the plate 1 and the conductive matter 2. The output buffer 42 can then amplify or filter the signal to provide an analog output signal 43.

Figure 8:
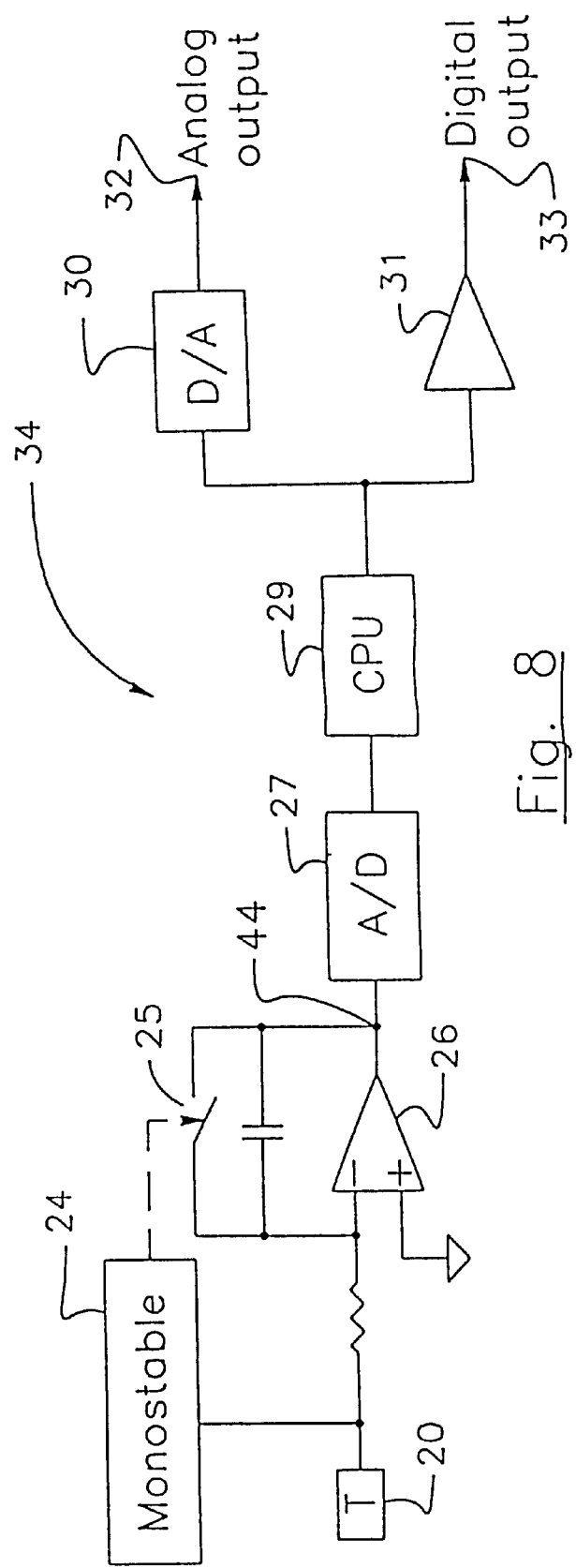
FIG. 8 is a schematic diagram of a second embodiment of a circuit to make the measurement linear, according to the invention.

Referring to FIG. 8, there is shown another embodiment to linearize the signal with respect to the displacement. In this case, at the output of the integrator 25, there is connected an analog-to-digital converter 27. The digital signal can then be processed by a microcontroller 29 programmed to linearize the signal or to modify it. It should be noted that this method permits to correct any parasitic effect derived from the oscillator 22 or 48. At the output of the microcontroller 29, there is a buffer 31 directly providing a digital value 33, whereas the use of a digital-to-analog converter 30 provides an analog output 32.

While embodiments of this invention have been illustrated in the accompanying drawings and described above, it will be evident to those skilled in the art that changes and modifications may be made therein without departing from the essence of this invention. All such modifications or variations are believed to be within the scope of the invention as defined by the claims appended hereto.

What is claimed is:

1. A circuit for measuring a capacitance of a capacitive sensor, comprising:

charging circuit means for charging the capacitive sensor with a voltage, wherein the charging circuit means comprises a voltage source providing said voltage, and an electrical path connecting the voltage source to the capacitive sensor;

discharging circuit means for discharging the capacitive sensor, wherein the discharging circuit means comprises a ground and an electrical path connecting the capacitive sensor to the ground, the electrical paths of the charging and discharging circuit means having a common portion connecting with the capacitive sensor, wherein the electrical path of the charging circuit means further comprises a pair of resistors in series between the voltage source and the capacitive sensor, the resistor that is closest to the capacitive sensor being in said common portion;

trigger means for triggering the charging circuit means and the discharging circuit means in alternation into play as a potential of the capacitive sensor drops and rises to predetermined lower and upper levels, respectively, wherein the trigger means comprises a switch selectively opening and closing the electrical path of the discharging circuit means with the ground and having a pole connected to the ground and a pair of contacts, one of which is connected between the pair of resistors;

wherein the trigger means further comprises a pair of comparators connected to said switch, wherein said comparators have first inputs connected to the capacitive sensor and second inputs to receive respective reference potentials, and outputs producing comparison signals that control the selective operation of said switch, the reference potentials representing respectively the lower and upper levels;

output means for providing a signal having a low level during operation of one of the charging and discharging means, and whereby the signal has a period defined by a same level repetition which is indicative of the capacitance of the capacitive sensor.

2. The circuit according to claim 1, further comprising a follower coupled between the capacitive sensor and the trigger means.

3. The circuit according to claim 1, wherein:

the capacitive sensor has shielding means subjected to a same potential as a target matter affecting the capacitance of the capacitive sensor.

4. The circuit according to claim 1, wherein the high and low levels of the signal assume fixed values representing high and low logic states.

5. A circuit for measuring a capacitance of a capacitive sensor, comprising:

charging circuit means for charging the capacitive sensor with a voltage, wherein the charging circuit means comprises a voltage source providing said voltage, and an electrical path connecting the voltage source to the capacitive sensor;

discharging circuit means for discharging the capacitive sensor, wherein the discharging circuit means comprises a ground and an electrical path connecting the capacitive sensor to the ground, the electrical paths of the charging and discharging circuit means having a common portion connecting with the capacitive sensor, wherein the charging and discharging circuit means comprise a common resistor having an end connected to the capacitive sensor, and an opposite end;

trigger means for triggering the charging circuit means and the discharging circuit means in alternation into play as a potential of the capacitive sensor drops and rises to predetermined lower and upper levels respectively, wherein the trigger means comprises a switch selectively opening and closing the electrical path of the discharging circuit means with the ground and an output connected to the opposite end of the resistor, the output of the trigger means being alternately set at said voltage and to ground as a function of the potential of the capacitive sensor so that the capacitive sensor is charged or discharged respectively through the resistor;

wherein the trigger means further comprises a pair of comparators connected to said switch, wherein said comparators have first inputs connected to the capacitive sensor and second inputs to receive respective reference potentials, and outputs producing comparison signals that control the selective operation of said switch, the reference potentials representing respectively the lower and upper levels;

output means for providing a signal having a low level during operation of one of the charging and discharging circuit means and a high level during operation of the other one of the charging and discharging means; and whereby the signal has a period defined by a same level repetition which is indicative of the capacitance of the capacitive sensor.

* * * * *